United States Patent
Gagne et al.

(10) Patent No.: US 8,072,049 B2
(45) Date of Patent: Dec. 6, 2011

(54) POLYSILICON DRIFT FUSE

(75) Inventors: Nickole Gagne, Saco, ME (US); Paul Fournier, Scarborough, ME (US); Daniel Gagne, Biddeford, ME (US)

(73) Assignee: Fairchild Semiconductor Corporation, South Portland, MA (US)

( * ) Notice: Subject to any disclaimer, the term of this patent is extended or adjusted under 35 U.S.C. 154(b) by 144 days.

(21) Appl. No.: 12/429,510

(22) Filed: Apr. 24, 2009

(65) Prior Publication Data

US 2010/0270662 A1  Oct. 28, 2010

(51) Int. Cl.
*H01L 23/525* (2006.01)
(52) U.S. Cl. ............. 257/665; 257/755; 257/E23.149; 438/601
(58) Field of Classification Search .......... 257/529, 257/668, 755, E29.111, E21.592, 530, 665, 257/E23.149; 438/601, 208, 467, 600
See application file for complete search history.

(56) References Cited

U.S. PATENT DOCUMENTS

| | | | |
|---|---|---|---|
| 4,975,385 A | 12/1990 | Beinglass et al. | |
| 5,264,725 A | 11/1993 | Mullarkey et al. | |
| 5,303,402 A | 4/1994 | McLaughlin et al. | |
| 6,420,217 B1 | 7/2002 | Kalnitsky et al. | |
| 6,642,601 B2 | 11/2003 | Marshall et al. | |
| 2003/0205777 A1 * | 11/2003 | Ito et al. | 257/529 |
| 2005/0224910 A1 * | 10/2005 | Kuno et al. | 257/529 |
| 2008/0157201 A1 * | 7/2008 | Marshall | 257/350 |
| 2009/0140382 A1 * | 6/2009 | Gao et al. | 257/529 |

* cited by examiner

*Primary Examiner* — Thomas L Dickey
*Assistant Examiner* — Fazli Erdem
(74) *Attorney, Agent, or Firm* — Hiscock & Barclay, LLP

(57) ABSTRACT

A polysilicon resistor fuse has an elongated bow-tie body that is wider at the opposite ends relative to a narrow central portion. The opposite ends of the body of the fuse have high concentrations of N-type dopants to make them low resistance contacts. The upper portion of the central body has a graded concentration of N-type dopants that decreases in a direction from the top surface toward the middle of the body between the opposite surfaces. The lower central portion of the body is lightly doped with P-type dopants. The central N-type region is a resistive region.

11 Claims, 4 Drawing Sheets

POLYSILICON DRIFT FUSE

This invention relates to electrically blown fuses in, or packaged with, semiconductor devices, and more particularly, to polysilicon electrically blown fuses.

BACKGROUND OF THE INVENTION

Many of today's most popular electronics applications, such as personal computers and mobile phones, are migrating to lower operating voltages. This leaves less tolerance for errors and increases the accuracy requirements for components. This is especially true for amplifiers used in these applications. At the same time, volume for these products continues to grow, putting additional pressure on suppliers to reduce component costs.

One key amplifier parameter for system accuracy is input offset voltage. Various trimming techniques have been used to adjust amplifier offset voltage and other parameters. Indeed, trimming techniques have enabled an entire class of precision amplifiers to exist today. However, offset trimming and the improved accuracy it creates has not, for the most part, found its way into the high volume, low-cost CMOS amplifiers and A-to-D and D-to-A converters.

Some trimming techniques rely upon an exposed thin film resistor that is trimmed with a laser. Other techniques rely upon polysilicon resistors with thinned central portions that are exposed and cut with a laser.

Still other trimming techniques rely upon resistors that are selectively added or dropped from an integrated circuit by operating a fuse that is in series with the resistor. Such fuses are themselves polysilicon resistors. They have several advantages. For example, they have the ability to be blown without opening the packaged integrated circuit. In contrast to metal fuses which must have an opening to allow gases to escape, the polysilicon fuses do not. Polysilicon fuses can thus be used for trimming during wafer sort, final test, and in customer applications.

Typically polysilicon resistor fuses have a layer of silicide over the fuse to form a low resistance conductor for the current densities required to generate heat that creates a discontinuity in the polysilicon and in the silicide. However, the fuse must be designed, and the proper fuse current must be used, to prevent the silicide flows from reforming the electrical connection across the fuse after it has been initially blown.

For example, a conventional fuse is doped N+ during the N+ poly and N+ source/drain implants. Next, a silicide layer is deposited on the ends of the fuse to provide the resistive difference needed to blow the fuse. In one example the conventional fuse is a layer of polysilicon about 27 μm thick and has a resistivity of 21.44 Ohms/sq in the central region and a resistivity of 35.95 Ohms/sq on the outer ends. The N+ polysilicon body of the fuse is from with an N+ gate implant using a phosphorus species in the order of $1E16/cm^2$ and an N+ source/drain implant with an arsenic species on the order of $5.7E14/cm^2$. In another conventional example, where the poly thickness is also 27 um, the N+ gate implant is also phosphorus species on the order of 1E16/cm2 and the N+ source/drain is also an arsenic species on the order of 6.5E14cm2. This example provided a resistivity of 28.74 Ohms/sq in the central region and 6.2 Ohms/sq on the outer regions. That is almost a 5× factor and that is sufficient to easily blow such fuses. In a further conventional example, the polysilicon body was 34 um thick. It used an arsenic implant of approximately 1.08E16/cm2 for the N+ gate implant, and an arsenic implant of 2E15/cm2 for the N+ source/drain implant. It had a resistivity of 102 Ohms/sq in the central region and a 7.8 Ohms/sq on the outer edges providing a 13× resistance factor. These fuses blow easily.

Some prior art fuses are often difficult to blow because the silicide and unsilicided regions had similar resistivities. In the first example above, silicide provides only about a 1.6× difference in resistance between the ends the middle of the fuse. Based on the results of these examples, it is clear that the dopant concentration in the central region is not the only factor affecting the performance of the fuse. Other factors include and are not limited to the ratio of resistivity from outer edges to central region. Initial experience indicates that a ratio of 1:7 in resistivity between the outer edges (terminals) and the central body yields fuses that blow relatively easily.

Such silicide dependent polysilicon fuses have other drawbacks. First of all, one has to have a process that uses silicide or modify an existing process to add silicide. In order to form a silicide, the temperature of the device is likely heated to very high temperatures. That extra heat may alter the internal characteristics of the device by expanding small diffusion regions beyond their designed boundaries. Second, there is the possibility that, after the fuse is blown, the silicide will reform and thereby defeat the fuse. As such, it would be an advantage to have a polysilicon fuse compatible with a low heat budget CMOS process that does not require a silicide step.

SUMMARY

Examples of the polysilicon resistor fuse of the invention have elongated bow-tie bodies that are wider at the opposite ends relative to a narrow central portion. The opposite ends of the body of the fuse have high concentrations of N-type dopants to make them low resistance contacts. The upper portion of the central body has a graded concentration of N-type dopants that decreases in a direction from to top surface toward the middle of the body between the opposite surfaces. The lower central portion of the body is lightly doped with P-type dopants. The N+ ends and the N− central region prevent the formation of a P/N junction. Prior to application of a voltage to either end portion, the lower central P-type region will be depleted of holes. When a potential difference is applied across the fuse body, current flows from one end, through the central drift region and to the other end. For N-type polysilicon fuses, the carriers are only electrons, because all the holes are depleted from the lower central body. The graded N-type concentration provides a resistance to flow of electron current. This resistance is similar to the resistance provided by a drift region in a typical mosfet, thus the fuse is called a drift poly fuse. Drift regions can support a defined voltage or current, but breakdown when the voltage or current exceeds the limit. In the case of the polysilicon drift fuse, the current ruptures the polysilicon in the central region of the body. When the polysilicon ruptures, the current no longer has a path between the ends.

DRAWING

DETAILED DESCRIPTION

Figure 1:
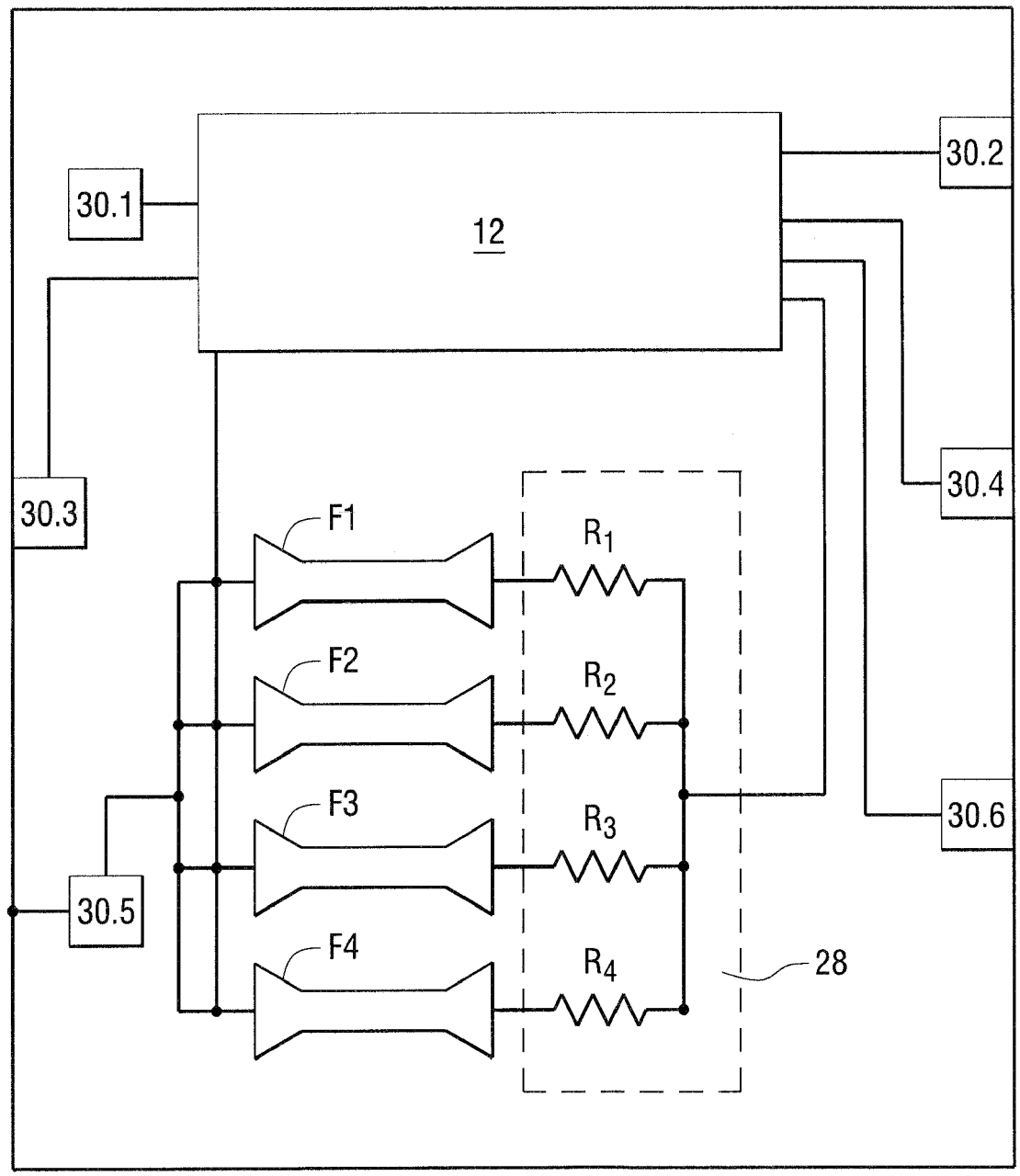
FIG. 1 is a plan view of an integrated circuit with one or more polysilicon drift fuses.

Turning to FIG. 1, there is an integrated circuit 10, such as a band gap regulator or a voltage controlled oscillator, that has a resistance network 28 that includes a number of polysilicon drift fuses F1-F4. Each fuse is in series with a corresponding resistor, R1-R4. The resistors R1-R4 are connected in parallel with each other. In this way, the effective resistance of the resistor network 28 is increased by blowing one of more fuses F1-F4 and thereby removing the blown fuse's resistance from the parallel resistor network 28.

The circuit 10 has input/output pins 30.1, 30.2, ... 30.n that are connected to one or more of the circuit elements (not shown) inside the device 12. Such circuit elements may include and are not limited to transistors, diodes, capacitors, inductors, resistors and other active or passive devices that can be fabricated on or in a semiconductor substrate. At least one input pin 30.5 is connected to the fuses F1-F4. The input pin 30.5 is multiplexed or otherwise enabled to communicate individually with each of the fuses in order to connect the fuse to a source of current sufficient to blow the fuse.

Figure 2A:
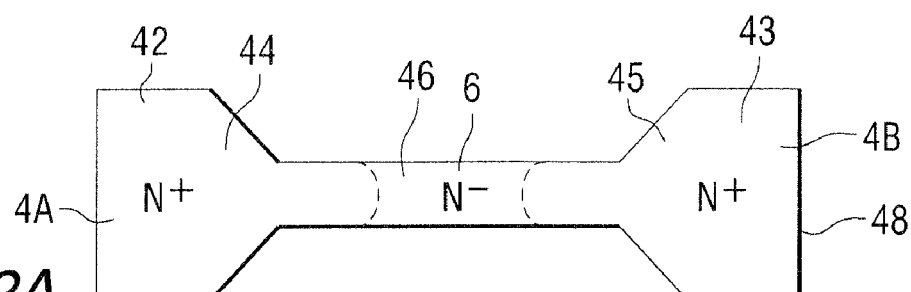
FIG. 2A is a plan view of an exemplary polysilicon drift fuse.

Each polysilicon drift fuse has a bow-tie shape as shown in FIG. 2A. A typical polysilicon drift fuse 40 has an elongated body 48. At opposite ends of body 48 are terminal regions 42, 43. Those regions are relatively large compared to the central region 46. Angled transition regions 44, 45 connect the end regions 42, 43 to the central region 46. The transition regions 44, 45 gradually reduce in width along the respective length in a direction toward the center to match the width of the central region 46.

Figure 2B:
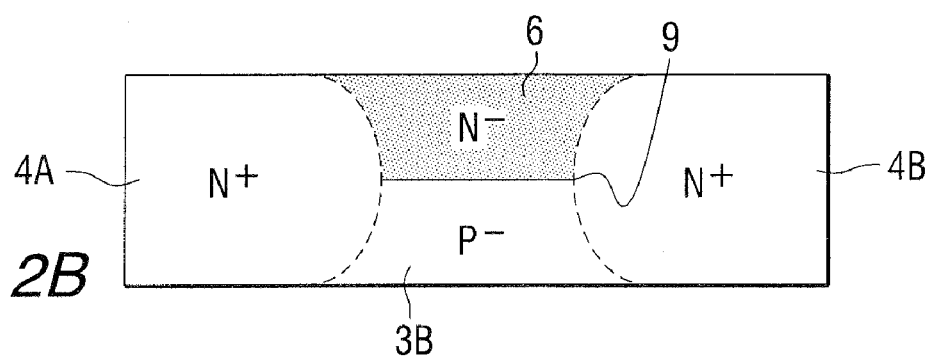
FIG. 2B is a sectional view of the polysilicon drift fuse of FIG. 2A.

The terminal regions 42, 43 have heavily doped with N-type regions 4a, 4b. See FIG. 2B. The N+ regions 4a, 4b extend from the one surface of the polysilicon drift fuse 40 to the other surface. Near the center, there is lower, uniformly doped P− layer 3B and an upper, graded N-doped region 6. The graded N-doped region 6 gradually decreases in N-type doping density toward the middle 9 of the body 48.

The resistance of the polysilicon drift fuse 10 is inversely proportional to the total dopant concentration in the central region 6 and its length. Its resistance is increased by making the region 6 longer, thinner, reducing the dopant concentration, or any combination thereof.

Prior to application of a voltage or current to either terminal region 42, 43, the lower central P-type region 3B will be depleted of holes. When a potential difference is applied across the fuse body 48, current flows from one terminal (42 or 43), through the central drift region 6 to the other terminal (43 or 42). For N-type polysilicon fuses, the carriers are only electrons, because all the holes are depleted from the lower central body. The graded N-type concentration in the central region 6 provides a resistance to flow of electron current. This resistance is similar to the resistance provided by a drift region in a typical mosfet, thus the fuse is called a polysilicon drift fuse. Drift regions can support a defined voltage or current limit, but breakdown when the voltage or current exceeds the limit. In the case of the polysilicon drift fuse, the current ruptures the polysilicon in the central region of the body. When the polysilicon ruptures, the current no longer has a path between the ends.

Figure 3A:
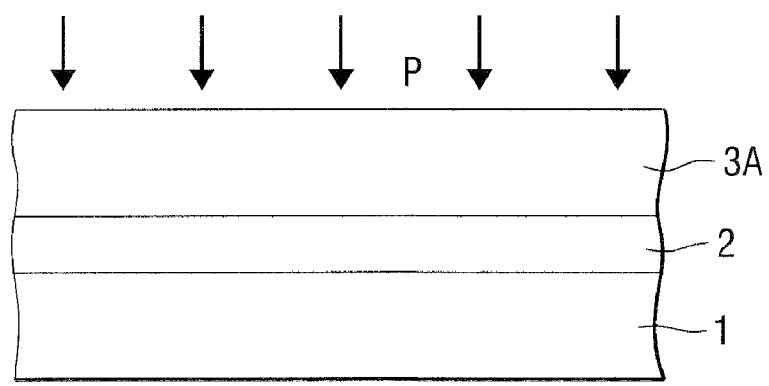
FIGS. 3A-3F are sequential process views of steps for forming the polysilicon drift fuse.

Steps for manufacturing examples of the invention are shown in FIGS. 3A-3F. Turning to FIG. 3A, a semiconductor substrate 1, typically P-type silicon, is locally oxidized to form a relatively thick layer 2 of thermally grown silicon oxide (LOCOS). Those skilled in the art know that LOCOS is a conventional process for electrically insulating and isolating one device from another. Next, a layer 3A of polysilicon is deposited by known means onto the oxide layer 2. The thickness of the polysilicon layer may vary, but typical thicknesses consistent with current manufacturing processes range from 27 µm to 50 µm, and preferably between 27 µm and 37 µm. The substrate 1 is placed in an ion implanter and polysilicon layer 3a is implanted with a light doping of P-type ions, in particular, boron. The substrate 1 is annealed to distribute the P-type ions throughout the substrate and thereby form a substantially uniform doped layer 3a.

Figure 3B:
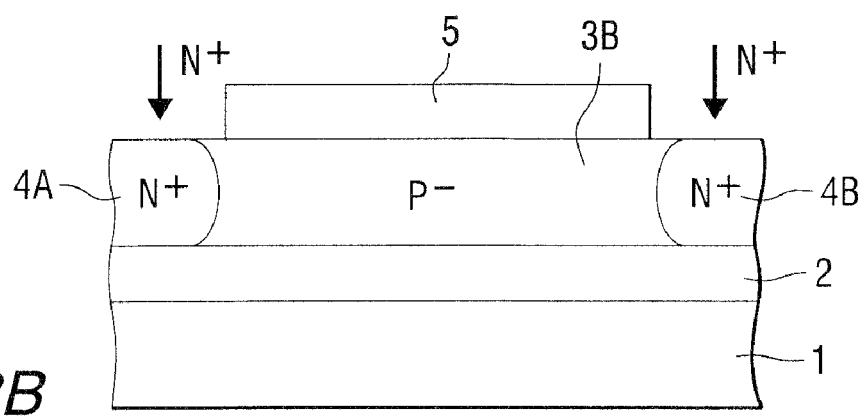

Turning to FIG. 3B, the substrate 1 is covered with a layer of photoresist. That layer is exposed to light through a mask (not shown) to develop (harden) certain regions such as region 5. The undeveloped resist is removed with a liquid or dry etch and the substrate is again placed in an ion implanter. This time N-type ions, phosphorous or arsenic, are implanted in the exposed portions of the substrate, namely terminal regions 42, 43. The mask 5 prevents the ion from implanting the central region. The N-type ions are implanted at the same time as the gate and the source and drains are implanted. As such, the implant shown in the figure is representative of the gate implant and the source and drain implant.

Figure 3C:
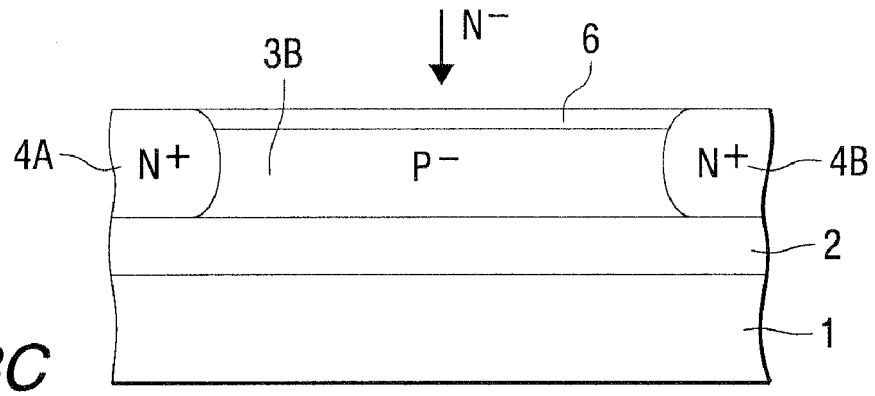
Figure 3D:
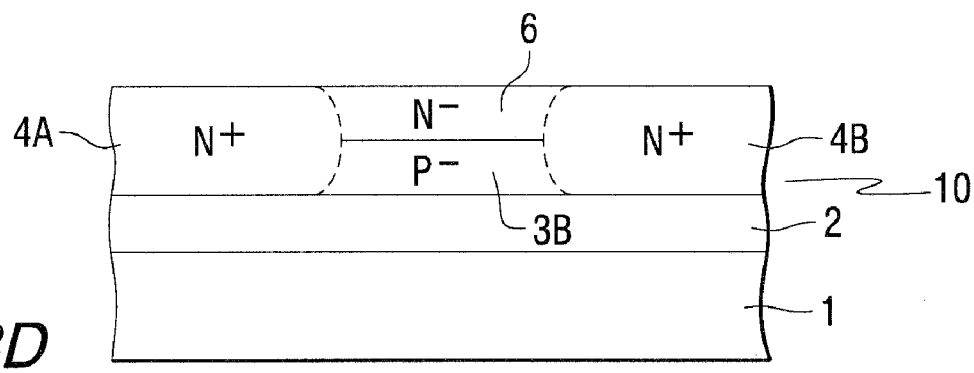
Figure 3E:
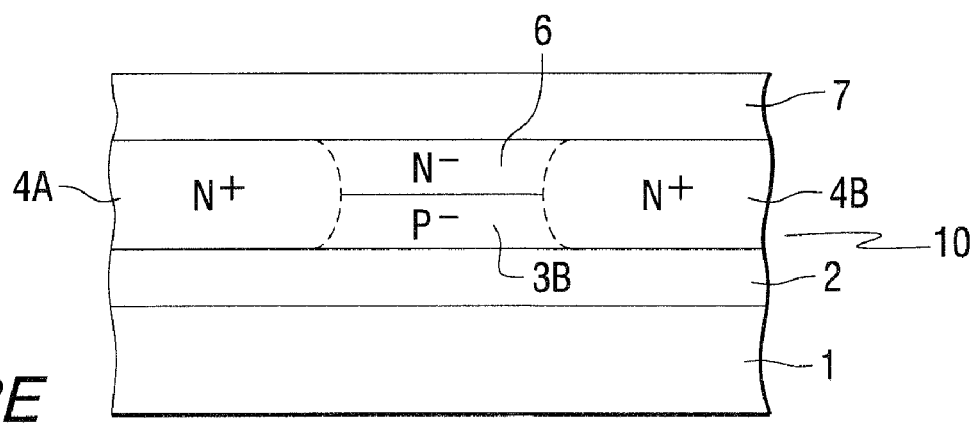
Figure 3F:
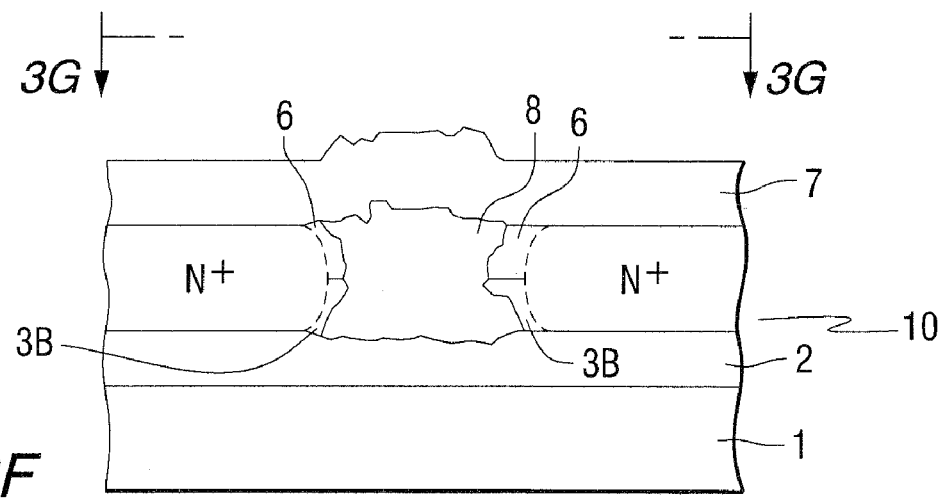
Figure 3G:
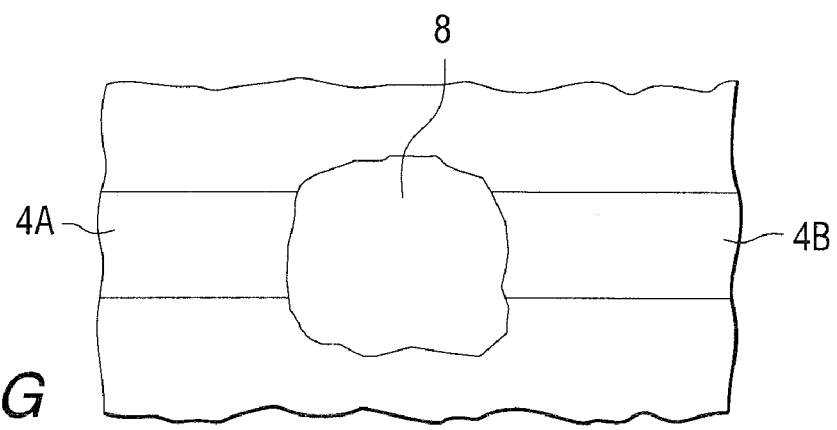
FIG. 3G is a plan view of a blown polysilicon drift fuse.

As shown in FIG. 3C, the photoresist mask 5 is removed and the substrate is again implanted with a light dose of N-type ions to form doped region 6. In an annealing step (FIG. 3D) the substrate is heated to drive in the ions from the lightly doped N-type region 6 and from the heavily doped N+ regions 4a, 4b. Layer 3, in particular region 3B is implanted with light dose of N-type phosphorous ions in the order of $2.5e^{14}$ atoms/cm$^2$. That is only one level of dose. Those skilled in the art understand that the dose may be varied to achieve a desired resistance commensurate with the drivers used to operate the fuse. The implanted ions diffuse into the region 3B and form, in effect, a drift region between heavily doped N+ regions 4a, 4b. The lightly doped graded N− region 6 prevents a P/N junction from forming between the two heavily doped N+ end regions 4a, 4b. The lightly N-doped central region 6 establishes the resistance of the polysilicon drift fuse 10. In a final step, the polysilicon drift fuse 10 is covered with a layer 7 of oxide. The layer 7 is preferably a deposited oxide.

One of the advantages of the invention is that the polysilicon drift fuses can be integrated into existing mosfet processes. The polysilicon layer for the body may be formed from the gate polysilicon layer. Likewise, the N+ doping of the ends 4a, 4b is done at the same times as the polysilicon gate is doped to form the gate electrode and the source and drain regions are formed. In the above embodiment, the doping dose of the boron is 3.5E14/cm$^2$. The dopant amount largely depends on the thickness of the polysilicon layer 3A. In a typical process, the P− implant dose is chosen to provide a P− type polysilicon resistivity of 2,382 Ohms/sq. Conventional fuses do not use a P− dopant in the central region. Instead, conventional fuses are primarily doped N+ during the N+ polysilicon implant and during the N+ source/drain implants. Such conventional fuses have a silicide layer on the ends to provide the resistive difference needed to blow the fuse.

When the polysilicon body 3A is masked and provided with a P− central implant and a gradient N-doping, most of the P− implant is driven down, and there is a counter doping of lightly doped N-type ions. It is estimated that the resistivity in the central region cannot be much less than 1500 Ohms/sq. This makes a fuse with a resistivity of 35.95 Ohms/sq on the edges to 1500 Ohms/sq in the central region, providing a 41× resistance factor.

In operation, a fuse control circuit, not shown but familiar to those skilled in the art, applies a fast pulse of voltage across the terminals 4a, 4b of the polysilicon drift fuse. When the pulse is applied to the fuse body 48, the body heats up, the polysilicon ruptures, and the connection between the two ends is severed. The pulse leaves a void 8 or a region of high resistance including lightly doped polysilicon and melted silicon dioxide. In theory, the pulse heats up the central region, thereby lowering its resistance. As the resistance lowers, the heat increases until the polysilicon melts and severs the connections between the ends 4a, 4b. When the material cools and returns to a solid, the material is denser than before and it leaves an opening between the ends 4a, 4b.

When the polysilicon melts some of the oxide in layers 7 and 2, may also melt. When viewed through a microscope, the region 8 has a bulging shape between the 4a, 4b. In theory, the bulge is likely a mixture of lightly doped polysilicon and silicon dioxide. The resistance of the bulge 8 is relatively high compared to fuses where layer 6 is intact. Measurements have placed the resistance in the high megOhm to gigOhm range.

Another feature of the embodiments of the invention is that they do not require silicide for performance. However, the embodiments of the invention do not preclude using silicide. In fact, one may add silicide to the outer edges of the inventive fuse embodiments and thereby further enhance its performance. The silicide will lower the resistivity on the outer edges thereby increasing the ratio of resistivity between the edges and the central body.

If the resistors are in a ladder network, such as multiple resistors disposed between two parallel conductors, the removal of each resistor increases the net resistance between the two conductors.

The polysilicon drift fuses of the invention may be applied to many circuits to alter the resistance of a network of resistors. Resistor networks are found in numerous linear circuits such as voltage controlled oscillator where the frequency of the oscillator is controlled by the applied voltage and that voltage is taken from a resistor network. Another application is a band gap regulator circuit or any voltage regulated circuit where it is important to set the over and under voltage protection. It is more accurate to set such voltages with a resistor network than to attempt to fabricate precise devices with the required under and over settings.

Further embodiments of the invention add other circuit elements, such as capacitors and inductors. Such other elements may be selectively added or removed using the polysilicon drift fuse of the invention.

In still further embodiments, sub-circuits or sub-networks are also selectively added or removed using the polysilicon drift fuse of the invention.

Experimental tests showed that fuses made with embodiments of the invention have superior performance to conventional fuses. In particular, fuses embodying the invention require less current than conventional fuses. This benefit allows the designer to reduce the size of the driver transistors that are used to blow the fuses. As a result, devices and integrated circuits that embody the invention have more space for active devices and require less space for passive fuses and their drivers.

While the examples of the invention are shown with N-type carriers, those skilled in the art understand that similar examples could be constructed with P-type carriers. In addition, although silicide is not required, those skilled in the art may use conventional silicide technology to the examples. For example, a layer of silicide may be formed on top of the body 48. Typical silicide technology leaves a small silicide gap in the middle of the central region 6.

The invention claimed is:

1. An integrated circuit with one or more electrical fuses comprising:
   a substrate of silicon holding one or more semiconductor devices forming an integrated circuit;
   a layer of oxide on the silicon substrate;
   a fuse comprising an elongated body of polysilicon disposed on the oxide layer, said polysilicon body having opposite end portions connected to each other with a central portion, each opposite end portion comprising a heavy concentration of dopants of a first polarity and the central portion having a uniform region with a light doping of a second polarity dopant and a gradient region having a graded doping of the first polarity dopants that decreases in concentration in a direction toward the uniform region.

2. The integrated circuit of claim 1 wherein the end portions are covered with a highly conductive alloy.

3. The integrated circuit of claim 2 wherein the conductive alloy is a refractory metal silicide.

4. The integrated circuit of claim 3 wherein the refractory metal silicide included one or more metals from the group consisting of titanium, tungsten, platinum, and palladium.

5. The integrated circuit of claim 1 wherein the central body portion is narrower than the end portions.

6. The integrated circuit of claim 1 wherein the first polarity dopant is an N-type dopant and the second polarity dopant is a P-type dopant.

7. The integrated circuit of claim 6 wherein the first polarity dopant is one of the group consisting of arsenic or phosphorous.

8. The integrated circuit of claim 1 wherein the ratio of resistivity between either end portion of the fuse and the central portion of the fuse is more than 1:7.

9. A method for forming integrated circuit with one or more electrical fuses comprising:
   forming an insulating oxide layer on a substrate of silicon holding one or more semiconductor devices;
   depositing a layer of polysilicon on the oxide layer;
   implanting the polysilicon layer with a light, uniform dose of a implant of a first polarity;
   masking and selectively removing portions of the oxide layer to provide openings to the polysilicon layer;
   implanting the polysilicon layer with a heavy dose of dopants of a second polarity;
   removing the remainder of the mask and implanting the polysilicon with a light dose of dopants of a second polarity;
   diffusing the light dose of dopants of a second polarity into the polysilicon to form a graded region of second polarity dopants that gradually decreases away from the exposed surface of the polysilicon to form a fuse comprising an elongated body of polysilicon disposed on the oxide layer, said polysilicon body having a central portion with a light doping of a first polarity dopant, end portions highly doped with second polarity dopants of opposite polarity, and an intermediate drift region between the two heavily doped regions, said intermediate drift region having a graded doping of the second polarity dopants that decreases in concentration in a direction away from the polysilicon surface.

10. The integrated circuit of claim 1 wherein the uniform region of the central body is uniformly doped with said first polarity dopants.

11. The integrated circuit of claim 1 wherein the non-gradient region of the central body is on the oxide layer.

* * * * *